US005106311A

United States Patent [19]

Yodogawa et al.

[11] Patent Number: 5,106,311

[45] Date of Patent: Apr. 21, 1992

[54] CONNECTOR

[75] Inventors: Akihiro Yodogawa; Chiaki Arai, both of Kamakura, Japan

[73] Assignee: E. I. du Pont de Nemours and Company, Wilmington, Del.

[21] Appl. No.: 593,841

[22] Filed: Oct. 5, 1990

[30] Foreign Application Priority Data

Oct. 6, 1989 [JP] Japan ............................ 1-117924[U]

[51] Int. Cl.[5] ............................................ H05K 1/00

[52] U.S. Cl. ...................................... 439/77; 439/492; 439/329; 439/60

[58] Field of Search ............ 439/60, 67, 77, 492–499, 439/329, 55, 595

[56] References Cited

U.S. PATENT DOCUMENTS

| | | | |
|---|---|---|---|
| 3,149,896 | 9/1964 | Hall | 439/329 |
| 4,480,886 | 11/1984 | Bergamin | 439/492 |
| 4,629,271 | 12/1986 | Awano | 439/77 |
| 4,640,562 | 2/1987 | Shoemaker | 339/17 F |
| 4,718,859 | 1/1988 | Gardner | 439/635 |
| 4,734,053 | 3/1988 | Imai | 439/329 |

FOREIGN PATENT DOCUMENTS 320250 6/1989 European Pat. Off. .

*Primary Examiner*—David L. Pirlot

[57] ABSTRACT

A connector comprises, a housing having at least one open side surface, a plurality of contact end portions alternately arranged at a first position which is spaced away from the opening by a predetermined distance along a first surface perpendicular to the open side surface in the housing, and is close to a surface opposite the first said surface, and at a second position closer to the opening than the first position by a predetermined distance and shifted to the first side surface, and a slider having a structure which can be fitted in the housing to clamp a cable inserted forwards the first side surface in said housing for electrical connection with the contact end portion in the housing, the slider having an indentation at a distal end portion.

4 Claims, 4 Drawing Sheets

CONNECTOR

BACKGROUND OF THE INVENTION

1. Field of the Invention

The present invention relates to a connector for electrically connecting a flexible cable, in which contact terminals are arranged with high density, to an electrical circuit such as a printed circuit board and, more particularly, to a small-sized connector which can achieve excellent contact with a flexible cable in which a large number of contact terminals are alternately arranged in a staggered form at very small pitches.

2. Description of the Related Art

Recently, the sizes of electrical circuits such as printed circuit boards have been extremely reduced. At the same time, a demand has arisen for increased integration densities of the circuits themselves. In order to meet these demands, small-sized, high-density flexible cables and connectors have been produced to connect between these types of electrical circuits. For this reason, in e.g., a flexible cable, contact terminals are alternately arranged in staggered form, so that a large number of contact terminals can be arranged with high density in a very small area. Such a flexible cable is connected to a connector attached to a high-density connecting portion of a printed circuit board.

A conventional connector of this type includes contactors arranged on one side surface of a connector housing and brought into electrical contact with contact terminals of a cable inserted in the housing. The connector also includes a slider for urging the contact terminals of the flat flexible cable, inserted in the connector housing, against the contactors in the connector housing and connecting the terminals to the contactors. After the cable is inserted in the housing, this slider is fitted into the housing to clamp the connecting portion of the cable with the one side of the housing.

When the contact terminals of the cable are arranged in staggered form as described above, however, contact terminals are alternately arranged at front and rear positions with reference to the end portion of the cable, along their longitudinal direction. Therefore, a contactor train in the connector housing which is electrically connected to the contact portions of the cable is arranged to have an interval in a direction to insert the cable. Therefore, the size of the connector housing is increased. In addition, space for a cable inserted in and connected to the connector housing and space to allow for fitting the slider are required. Therefore, in the arrangement of a conventional connector, the size of the entire connector is inevitably increased. Another problem is that when the cable is clamped with the connector housing for connection, or when the cable is disconnected from the connector, the distance of movement. i.e. removal and insertion of the slider with respect to the connector housing, is increased, thus increasing the size of the entire connector.

SUMMARY OF THE INVENTION

It is, therefore, an object of the present invention to provide a connector which can minimize the pitches of contact terminals of a cable and connector serving as connecting means, since these pitches are required by the development of a high-density electrical circuit such as a printed circuit board, and which can decrease the size thereof while maintaining an excellent connection between the cable and connector.

In order to achieve the above object, according to the present invention there is provided a connector comprising a housing having at least one open side surface, a plurality of contact end portions alternately arranged at a first position which is spaced away from the opening by a predetermined distance along a first surface perpendicular to the open side surface in the housing, and is close to a surface opposite the first side surface, and at a second position closer to the opening than the first position by a predetermined distance and shifted to the first side surface, and a slider having a structure which can be fitted in the housing to clamp a cable inserted forward the first side surface in the housing for electrical connection with the contact end portion in the housing, the slider having an indentation in its distal end portion.

According to the connector of the present invention with the above arrangement, the contactors on one side surface in the connector housing are also alternately arranged in a staggered form in correspondence with the contact terminals arranged in the cable to be connected. In other words, the contactors are arranged at the front and rear positions with respect to the insertion port for the cable in the housing. In addition, the heights of the terminals are changed in a direction perpendicular to the direction of insertion of the cable. Therefore, even if the pitch between the adjacent contact terminals is very small, in each of the terminal trains having different heights, sufficient pitches can be obtained to achieve excellent electrical connection with the corresponding contact terminal of the cable, with high reliability. In the cross section of the slider, the thickness of a portion extending for a predetermined length from the end face to be inserted in the connector housing, is set to be smaller than the thickness of the entire slider. Therefore, a gap required to insert the cable is formed between the slider and the inner wall of the housing, so that a flat cable is inserted in the connector housing without completely removing the slider from the housing.

Thus, the contact end portions of the contactors in the housing are staggered in two directions, i.e., in a back-and-forth direction and direction of height. Utilizing this arrangement of the contactors, a thin portion is formed at the distal end portion of the slider to compensate for the difference in the heights of the contact end portions. This thin portion of the slider is utilized as a gap formation means to insert a flexible cable, and as an urging member for the contact end portions of the lower position. Therefore, the space required to insert the cable, and the size of the slider in the conventional connector of this type, are minimized, thus achieving a small-sized connector. This is one of the features of the present invention.

As described above, in the connector of the present invention, the contact terminals of the cable are alternately arranged in a staggered form, and the contact end portions of the contactors in the connector housing are also alternately arranged at the first and second positions in correspondence with the arrangement of the terminals in the cable. In addition, the indentation is formed in the distal end portion of the slider for clamping the cable inserted in the housing. Therefore, a small-size connector which can achieve highly reliable electrical connection can be obtained even if pitches between the contact terminals are extremely decreased.

DETAILED DESCRIPTION OF THE PREFERRED EMBODIMENTS

Figure 1:
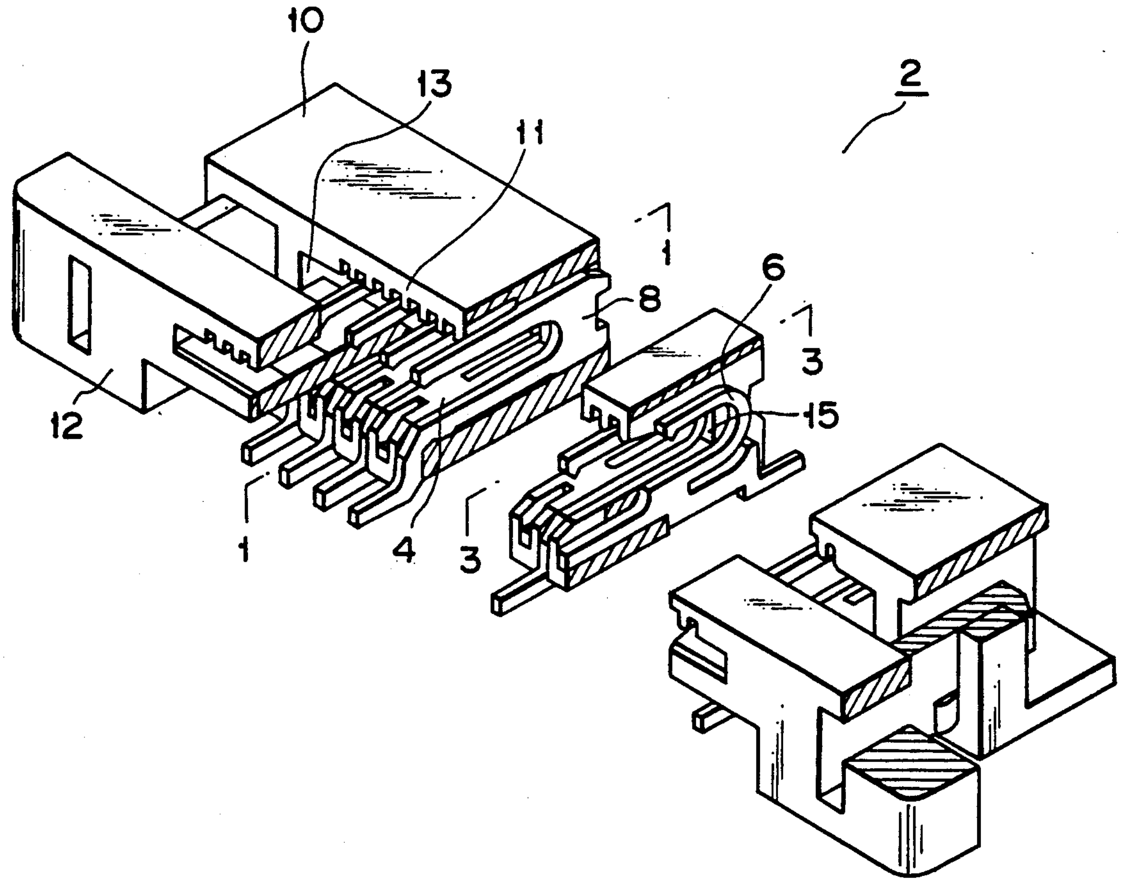
FIG. 1 is a perspective view of a connector according to an embodiment of the present invention.

FIG. 1 shows an embodiment of the present invention. A connector 2 shown in FIG. 1 includes a housing 10, in which a large number of first and second contactors 6 and 8 are alternately and linearly arranged, and a slider 12, fitted into the housing. A first side surface 11 of the housing 10 is open, and an internal space 4 of the housing communicates with the outside.

Figure 2:
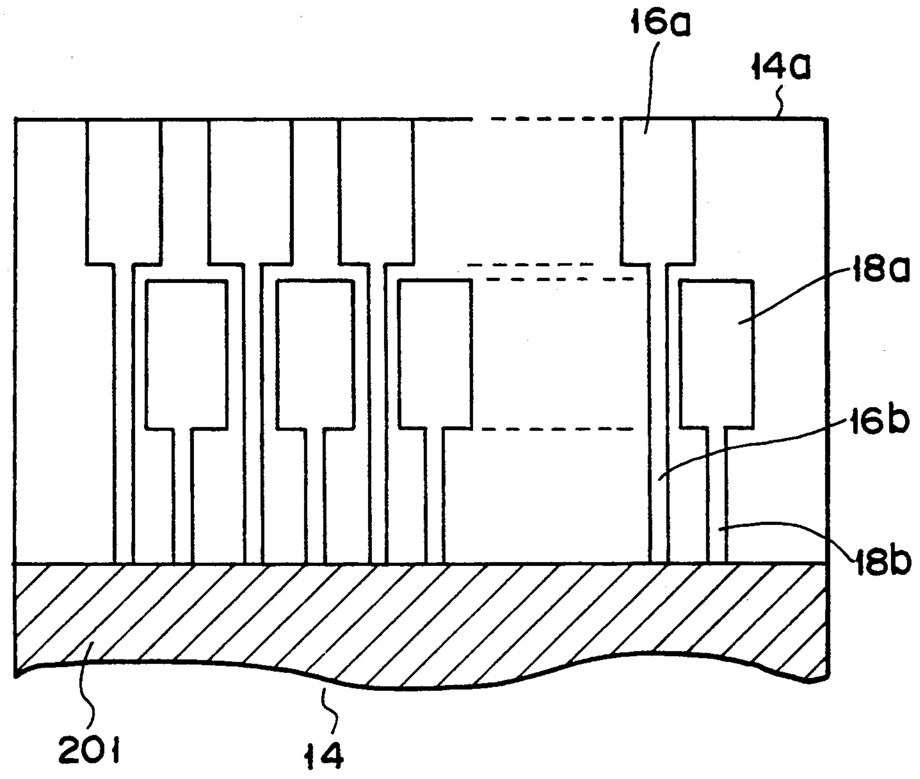
FIG. 2 is a view showing a flexible cable connected to a connector of the present invention and, in particular, the arrangement of contact terminals.

FIG. 2 is a plan view of a flexible cable 14 used for the connector of the present invention. The flexible cable 14 includes a large number of conductors (lead wires) arranged parallel to each other on a base consisting of an insulating material. In an end portion of the cable, each lead wire has a contact terminal 16*a* or 18*a*. The terminals 16*a* and 18*a* are alternately arranged in a staggered form on the base. Each of portions 16*b* and 18*b* in the lead wires which are not in contact with the connector are covered with an insulating protective film 20.

Figure 3:
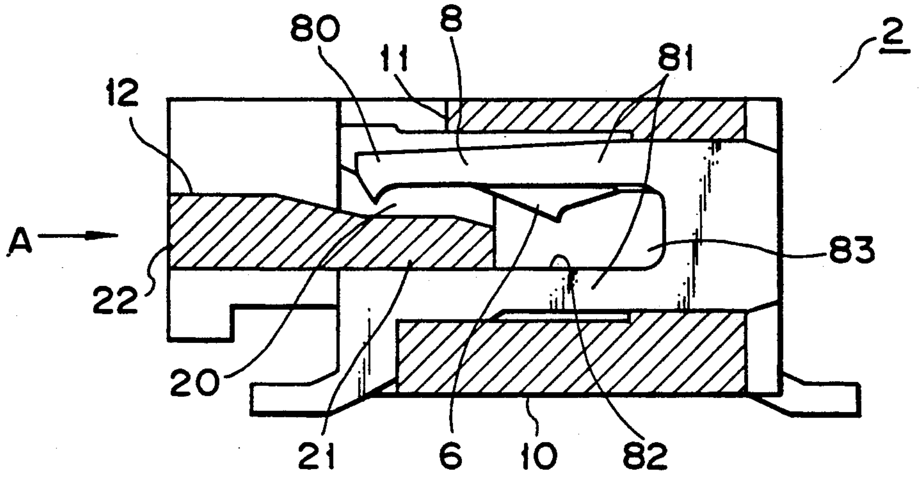
FIGS. 3 and 4 are sectional views respectively taken along the lines 1—1 and 3—3 of FIG. 1, each showing the shape of a side surface of a contactor which constitutes the connector of the present invention, and showing the positional relationship between the connector housing and the slider.
Figure 4:
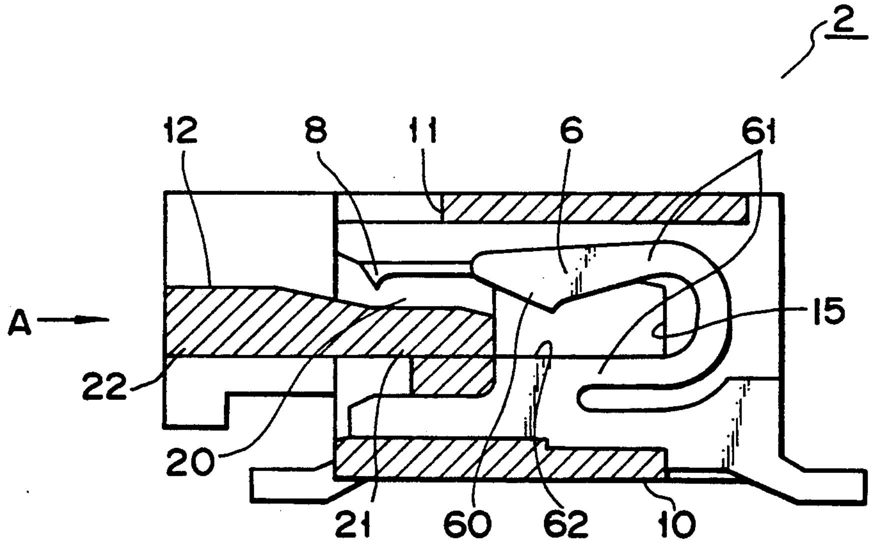

FIG. 3 is a cross-sectional view of the connector 2 taken along the line 1—1 of FIG. 1, and FIG. 4 is a cross-sectional view of the connector 2 taken along the line 3—3 of FIG. 1. A large number of first and second contactors 6 and 8 alternately and linearly arranged in the housing 10 have arm portions 61 and 81, respectively. The cross section of each of the arm portions 61 and 81 is substantially U shaped, as shown in FIGS. 3 and 4. The first and second contactors 6 and 8 have contact end portions 60 and 80, at the end portions of the arm potions 61 and 81, respectively. A surface 62 opposite the contact end portion 60 of the arm portion 61 and a surface 82 opposite the contact end portion 80 of the arm portion 81 are located on the same plane.

A difference between the contactors 6 and 8 is that the positions of the contact end portions 60 and 80 are shifted relatively in two directions, i.e. back-and-forth and heightwise. First, the contact end portion 60 of the contactor 6 is located at a first position which is spaced away from the opening portion by a predetermined distance in a direction along a first surface 13, perpendicular to the first side surface 11 of the housing 10, i.e. the direction A of insertion of the slider 12 to the connector housing 10, and is close to the surface 15 opposite the first side surface 11. In contrast to this, the contact end portion 80 of the contactor 8 is located at a second position which is closer to the opening portion than the first position by a predetermined distance, and is shifted toward the first side surface 11. Second, the heights of the contact end portions 60 and 80 are different from each other, i.e., the contact end portion 60 of the first contactor 6, far from the opening portion of the housing, extends farther than the contact end portion 80 of the second contactor 8 with respect to the opposite surfaces 62 and 82. As shown in FIG. 1, therefore, the contact end portions 60 of the plurality of contactors 6 are linearly arranged to form a single train, while the contact end portions 80 of the other contactors 8 are linearly arranged to form another single train. The contactors 6 located deep in the housing ar brought into electrical contact with the contact terminals 16*a*, linearly arranged near the end portion 14*a* of the flexible cable 14 as shown in FIG. 2, at the contact end portions 60, and the contactors 8 located near a cable insertion port in the housing are brought into electrical contact with the contact terminals 18*a* linearly arranged at the contact end portions 80, at positions farther from the end portion 14*a* of the flexible cable 14 than the other contact terminals 16*a*.

Gaps 63 and 83, respectively formed by the arm portions 61 and 81 of the contactors 6 and 8, receive the flexible cable 4 and the slider 12.

The thickness of the slider 12 is changed substantially in correspondence with the heights of the gaps 63 and 83 respectively formed by the arm portions 61 and 81 of the contactors 6 and 8. More specifically, in the slider 12, an indentation 20 is formed in a part extending from the distal end by a predetermined distance, as shown in the cross-sectional views in FIGS. 3 and 4. The thickness of the portion in which the indentation 20 is formed is less than that of the other portion.

The indentation 20 of the slider 12 extends in the direction of insertion into the housing to a point substantially intermediate between the first and second contact end portions with respect to the side surface 15, opposite the opening side surface 11. The indentation 20 is preferably formed such that when the slider 12 is inserted into the space 4 in the housing 10, i.e. into a gap formed by the contactors 6 and 8 arranged in the housing 10, and abuts against the end of the gap, i.e. the deepest portions of the arms 61 and 81 of the contactors 6 and 8, the boundary between a thin portion 21 and the other portion 22 in the slider 12 is located between the contact end portions 60 and 80 of the above-mentioned two types of contactors 6 and 8, which are staggered. In addition, the depth of the indentation 20 of the slider 12 is preferably more than the thickness of the flexible cable to be connected. Moreover, as shown in FIGS. 3 and 4, in the cross-sectional shape of the indentation 20 formed in the slider 12, a smoothly inclined surface is preferably formed without a sharp step at the boundary between the thick and thin portions 21 and 22 of the slider 12.

Figure 5:
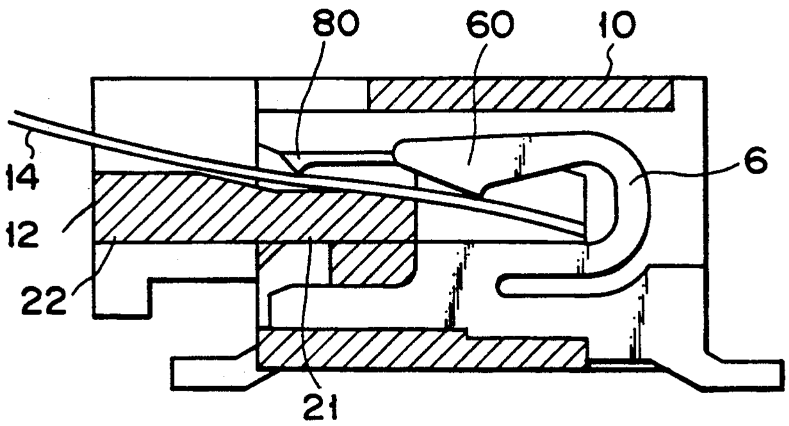
FIGS. 5 and 6 are sectional views respectively taken in the same manner as in FIGS. 3 and 4, for explaining the relationship between the connector and the cable achieved when the cable is attached to the connector according to the present invention.
Figure 6:
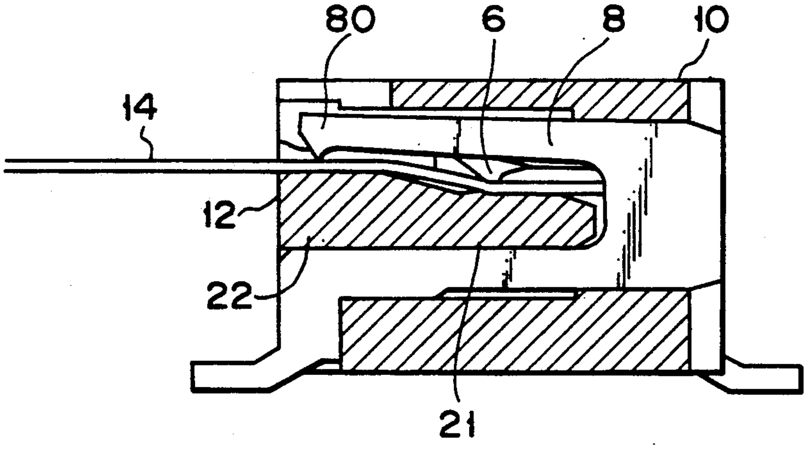

Use of the connector according to the present invention with the above arrangement will be described below with reference to FIGS. 5 and 6. As shown in FIG. 5, the slider 12 is removed from the connector housing 10 by a distance corresponding to the length of a substantially horizontal flat portion of the indentation 20. While the thin portion 21 is entirely or partially left in the housing, the cable 14 is inserted into the gaps 63 and 83 of the contactors 6 and 8 in the housing 10 through the gap between the contactor 8 near the cable insertion port in the connector housing 10 and the slider 12. At this time, the cable 14 is inserted into the gaps 63 and 83 of the contactors 6 and 8 while being smoothly curved along the inclined boundary of the indentation 20 of the slider 12. As shown in FIG. 5, when the distal end of the cable 14 abuts against the end of the gap of the contactors 6 and 8, and before the slider 12 is completely inserted into the housing 10, a group of the contact ends 60, linearly arranged at a lower position far from the cable insertion port in the housing 10, abuts or substantially abuts against a group of the contact terminals 16*a* near the end portion of the cable 14. At the same time, a group of the contact end portions 80, which is linearly arranged at a higher position near the cable insertion port in the housing 10 abuts or substantially abuts against a group of the contact terminals 18*a* far from the end portion of the cable 14. When the slider 12 is pushed into the deep portions of the gaps of the contactors 6 and 8 in the housing 10 from the above state, the slider 12 pushes up the contact terminals 16*a* and 18*a* of the cable, and the contact end portions 60 and 80 in the housing 10, and causes the contact terminals 16*a* and 18*a* to be respectively urged against and brought into contact with the contact end portions 60 and 80 by required pressures. In addition, the cable 14 is clamped and fixed in the connector housing 10. As shown in FIG. 6, in this state, the contact terminals 16*a* of the cable are pushed up by the flat surface of the thick portion 22 of the slider, and are urged against and brought into contact with the contact end portion 80 located at a higher position in the connector. The contact terminals 18*a* of the cable are pushed up by the horizontal flat surface of the thin portion 21 of the slider, and are urged against and brought into contact with the contact end portion 60 located at a lower position in the connector. A cable portion between contact points with these contactors has a shape substantially conforming to the inclined surface of the slider 12. Therefore, the cable 14, held and fixed in the connector housing 10, can maintain its smooth shape along the indentation 20 of the slider 12 without being bent. Therefore, the contact terminals 16*a* and 18*a*, and the lead wire portions 16*b* and 18*b* of the cable 4 can be free from damage, and an electrical disconnection portion is not formed.

As has been described above in detail, according to the connector of the present invention, the contact terminals of the cable are alternately arranged in a staggered form, and the contactors in the connector housing are also arranged such that their contact end portions are alternately arranged in a staggered form. Therefore, each contact terminal can be excellently electrically connected even if pitches between the contact terminals are extremely decreased along with the development of a high-density, small-sized printed circuit board to be connected to the connector. At the same time, in the contactors alternately arranged at front and rear portions in the connector housing, their heights with respect to a direction to be brought into contact with the cable are different from each other, and an indentation is formed in the slider in association with the difference of the height. Therefore, the size of the connector housing itself and the moving distance of the slider with respect to the connector housing can be decreased. Thus, not only the size of the connector can be decreased, but also insertion of the cable into the connector housing can be smoothly performed, and the cable can be brought into electrical contact with the connector with high reliability.

What is claimed is:

1. An electrical connector for electrically contacting a plurality of conductors of a flat flexible substrate comprising:

a housing of insulating material having one side surface which is open to define a channel within said housing for receiving said flexible substrate;

a plurality of first and second electrical contacts arranged alternately side by side within said channel, each of said first electrical contacts having a first contact end portion and each of said second electrical contacts having a second contact end portion for electrically contacting one of said conductors of said flexible substrate, all of said first and second contact end portions extending horizontally in said channel toward said open side surface of the housing, the first contact end portions all extending a predetermined distance toward said open side surface which is greater than the distance all of said second contact end portions extend, each of said first and second contact end portions having contact end surfaces which extend vertically in said channel to a predetermined depth, each of the contact surfaces of said first contact end portions extending vertically in said channel to a depth which is less than the depth all of the contact end surfaces of the second contact end portions extend, and slider means for inserting said flat flexible substrate through said open side surface and into the channel of the housing to contact said first and second electrical contacts, said slider means including a forward end portion having a thickness which substantially corresponds to the depth all of the contact end surfaces of said second contact end portions extends and a rearward portion having a thickness which substantially corresponds to the depth all of the contact end surfaces of said first contact end portions extend, thereby providing for electrical contact between each of said first and second contact end portions and a predetermined conductor of said flat flexible substrate.

2. The electrical connector of claim 1 wherein said first and second electrical contacts have U-shaped portions disposed in said channel, said first and second contact end portions alternately forming one arm of each of said U-shaped end portions of adjacent electrical contacts, the forward end portion of said slider means being adapted to slide within said U-shaped portions when inserted into said channel of the housing.

3. The electrical connector of claim 1 wherein said slider means is provided with an indentation which defines substantially said forward end portion, the depth of said indentation being greater than the thickness of said flat flexible substrate.

4. The electrical connector of claim 1 wherein each of said first and second electrical contacts is provided with an other contact end for contacting a circuit substrate, said other contact end of each of said first electrical contacts extending from one side of the housing and said other contact end of each of said second electrical contacts extending from a second side of the housing.

* * * * *